(12) United States Patent
Matsuno

(10) Patent No.: US 9,209,801 B2
(45) Date of Patent: Dec. 8, 2015

(54) HIGH FREQUENCY SWITCH CIRCUIT INCLUDING GATE BIAS RESISTANCES

(71) Applicant: Renesas Electronics Corporation, Kawasaki-shi (JP)

(72) Inventor: Noriaki Matsuno, Kawasaki (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 14/062,645

(22) Filed: Oct. 24, 2013

(65) Prior Publication Data

US 2014/0118053 A1    May 1, 2014

(30) Foreign Application Priority Data

Nov. 1, 2012   (JP) ................. 2012-242174

(51) Int. Cl.
  *H03K 17/687*    (2006.01)
  *H03K 17/693*    (2006.01)
(52) U.S. Cl.
  CPC .................. *H03K 17/693* (2013.01)
(58) Field of Classification Search
  CPC ................................... H03K 17/693
  USPC .................................. 327/434, 436
  See application file for complete search history.

(56) References Cited

U.S. PATENT DOCUMENTS

| 5,012,123 | A  | * | 4/1991  | Ayasli et al. ............... 307/112 |
| 8,334,718 | B2 | * | 12/2012 | Granger-Jones et al. ..... 327/308 |
| 8,461,903 | B1 | * | 6/2013  | Granger-Jones ............. 327/427 |
| 8,736,344 | B1 | * | 5/2014  | Birkeland et al. ........... 327/308 |

FOREIGN PATENT DOCUMENTS

| JP | 2006-174425 A | 6/2006 |
| JP | 2010-10728 A  | 1/2010 |

* cited by examiner

*Primary Examiner* — Kenneth B Wells
(74) *Attorney, Agent, or Firm* — McGinn IP Law Group, PLLC

(57) ABSTRACT

N (n is an integer more than one) number of transistors are connected in series in an order from a first transistor to an $n^{th}$ transistor from a first terminal to a second terminal. First to $n^{th}$ nodes are connected to gates of the first to $n^{th}$ transistors. N number of resistance elements are connected in series in an order from a first resistance element to an $n^{th}$ resistance element from a bias terminal to the $n^{th}$ node. The first resistance element is connected between said bias terminal and said first node, and the $k^{th}$ resistance element (k=2 to n) is connected between the $(k-1)^{th}$ node and the $k^{th}$ node. Thus, a high frequency switch circuit can reduce an area of the whole gate bias resistances.

12 Claims, 12 Drawing Sheets

Fig. 5

| | RESISTANCE VALUE (kΩ) |
|---|---|
| R(8) | 13.3 |
| R(7) | 7.1 |
| R(6) | 5.1 |
| R(5) | 4.2 |
| R(4) | 3.6 |
| R(3) | 3.3 |
| R(2) | 3.2 |
| R(1) | 1.6 |
| 合計 | 41 |

HIGH FREQUENCY SWITCH CIRCUIT INCLUDING GATE BIAS RESISTANCES

CROSS-REFERENCE

This application claims a priority based on Japanese Patent Application JP 2012-242174 filed Nov. 1, 2012. The disclosure thereof is incorporated herein by reference.

TECHNICAL FIELD

The present invention is related to a high frequency switch circuit.

BACKGROUND ART

A high frequency switch circuit is a switch circuit which handles a high frequency signal (RF signal). For example, a shunt switch as a kind of high frequency switch circuit plays a role to lead the high frequency signal to the ground in a turn-on condition. In other words, the shunt switch plays a role to dissipate the RF power.

FIG. 1 shows the configuration of the shunt switch disclosed in Patent Literature 1. The ground potential is applied to a ground (GND) terminal 2. A high frequency signal is applied to a high frequency signal terminal 3. N number of transistors M(1) to M(n) are connected in series between the ground terminal 2 and the high frequency signal terminal 3. The gate of each transistor M(k: k=1 to n) is connected to the bias terminal 4. Each transistor M(k) is turned on/off according to the potential of the bias terminal 4.

When each transistor M(k) is in the turn-on condition, the high frequency signal terminal 3 and the ground terminal 2 are short-circuited (shunt) to dissipate the RF power to the ground terminal 2. On the other hand, when each transistor M(k) is in the turn-off condition, the short circuit is not formed. In this turn-off condition, it is required to suppress leakage of RF power (the RF choke) from the gate of each transistor M(k) to the bias terminal 4 as much as possible. Therefore, a resistance element (gate bias resistance) is provided between the gate of each transistor M(k) and the bias terminal 4.

In the configuration shown in FIG. 1, n number of resistance elements are disposed between the bias terminal 4 and the gate of each of the n transistors M(1) to M(n). In other words, the n number of resistance elements are connected in parallel. Typically, the n number of resistance elements are designed to have a same resistance value. The configuration that the resistance element connected with the transistor M(n) has the maximum resistance value and the resistance values become smaller gradually as approximating to the transistor M(1) is disclosed in Patent Literature 1.

Patent Literature 2 discloses a technique that a change of a high frequency current which flows through each transistor is suppressed low to reduce a the high frequency distortion. According to the technique, a plurality of gate bias resistances are connected in series between the high frequency signal terminal and the bias terminal.

CITATION LIST

[Patent Literature 1] JP 2006-174425A
[Patent Literature 2] JP 2010-10728A

SUMMARY OF THE INVENTION

In a high frequency switch circuit, it is requested to reduce the whole area of gate bias resistances.

Other objects and new features will become clear from the Specification and the attached drawings.

In an embodiment, the high frequency switch circuit has n (n is an integer more than one) number of transistors connected in series in an order from a first transistor to an $n^{th}$ transistor from a first terminal to a second terminal. Nodes connected with gates of the first to $n^{th}$ transistors are first to $n^{th}$ nodes. The high frequency switch circuit further has n number of resistance elements connected in series in an order from a first resistance element to an $n^{th}$ resistance element from a bias terminal to the $n^{th}$ node. The first resistance element is connected between the bias terminal and the first node. A $k^{th}$ resistance element (k=2 to n) is connected between a $(k-1)^{th}$ node and a $k^{th}$ node.

In another embodiment, the high frequency switch circuit has n (n is an integer more than one) number of transistors connected in series in an order from a first transistor to an $n^{th}$ transistor from a first terminal to a second terminal. Nodes respectively connected with back gates of the first to $n^{th}$ transistors are first to $n^{th}$ nodes. The high frequency switch circuit further has n number of resistance elements connected in series in an order from a first resistance element to an $n^{th}$ resistance element from a bias terminal to the $n^{th}$ node. The first resistance element is connected between the bias terminal and the first node, and a $k^{th}$ resistance element (k=2 to n) is connected between a $(k-1)^{th}$ node and a $k^{th}$ node.

The whole area of gate bias resistances can be reduced in the high frequency switch circuit.

BRIEF DESCRIPTION OF THE DRAWINGS

FIG. 5 is a diagram showing a setting example of the resistance values of the resistance elements;

DESCRIPTION OF EMBODIMENTS

A high frequency switch circuit according to embodiments of the present invention will be described with reference to the attached drawings.

First Embodiment 1-1. Configuration

Figure 2:
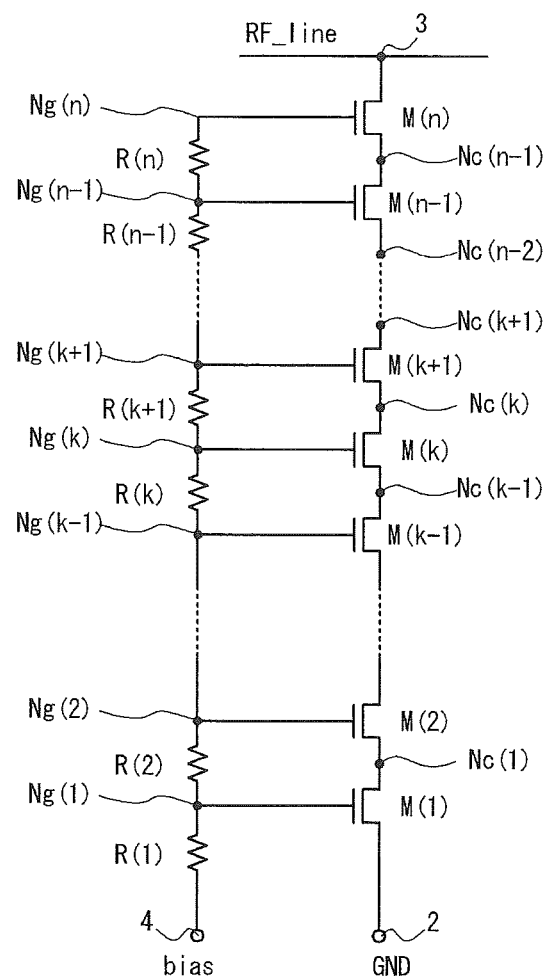
FIG. 2 is a diagram schematically showing the configuration of a high frequency switch circuit according to a first embodiment.

FIG. 2 is a diagram schematically showing the configuration of a high frequency switch circuit 1 according to a first embodiment. A case that the high frequency switch circuit 1 is a shunt switch will be described as an example. The high frequency switch circuit 1 has a ground terminal 2, a high frequency signal terminal 3, a bias terminal 4, n number of transistors $M(1)$ to $M(n)$ and n number of resistance elements $R(1)$ to $R(n)$. Here, n is an integer equal to or more than 2.

A ground potential is applied to the ground terminal 2. The high frequency signal terminal 3 is connected to a high frequency signal line RF line. A high frequency signal is applied to the high frequency signal terminal 3. A bias potential is applied to the bias terminal 4 to carry out ON/OFF control to the transistors $M(1)$ to $M(n)$.

The n number of transistors $M(1)$ to $M(n)$ are connected in series (stack-connected) between the ground terminal 2 and the high frequency signal terminal 3. For the convenience of the description, those n number of transistors $M(1)$ to $M(n)$ are referred to as a first transistor $M(1)$ to an $n^{th}$ transistor $M(n)$ in order from the ground terminal 2 for the high frequency signal terminal 3. It should be noted that an MOSFET, a compound semiconductor FET, an organic FET and so on are exemplified as each of the transistors $M(1)$ to $M(n)$.

A node which connects a $k^{th}$ transistor $M(k)$ and a $(k+1)^{th}$ transistor $M(k+1)$ is referred to as a $k^{th}$ connection node $Nc(k)$ hereinafter. A source and a drain of the first transistor $M(1)$ are connected to the ground terminal 2 and the first connection node $Nc(1)$, respectively. A source and a drain of the $k^{th}$ transistor $M(k: k=2$ to $n-1)$ are connected to the $(k-1)^{th}$ connection node $Nc(k-1)$ and the $k^{th}$ connection node $Nc(k)$, respectively. A source and a drain of the $n^{th}$ transistor $M(n)$ are connected to the $(n-1)^{th}$ connection node $Nc(n-1)$ and the high frequency signal terminal 3, respectively.

Also, a node connected to a gate of the $k^{th}$ transistor $M(k)$ is referred to as a $k^{th}$ gate node $Ng(k)$ hereinafter. In other words, the gates of the first transistor $M(1)$ to the $n^{th}$ transistor $M(n)$ are connected to the first gate node $Ng(1)$ to the $n^{th}$ gate node $Ng(n)$, respectively.

A first resistance element $R(1)$ is connected between the bias terminal 4 and the first gate node $Ng(1)$. Also, in case of $k=2$ to n, a $k^{th}$ resistance element $R(k)$ is connected between the $(k-1)^{th}$ gate node $Ng(k-1)$ and the $k^{th}$ gate node $Ng(k)$. That is, the first resistance element $R(1)$ to the $n^{th}$ resistance element $R(n)$ are connected in series in this order from the bias terminal 4 for the $n^{th}$ gate node $Ng(n)$. In other words, the n number of resistance elements $R(1)$ to $R(n)$ are connected in series between the bias terminal 4 and the $n^{th}$ gate node $Ng(n)$. These n number of resistance elements $R(1)$ to $R(n)$ function as the gate bias resistances which suppresses leakage of RF power from the gates of the transistors $M(1)$ to $M(n)$ to the bias terminal 4 when the high frequency switch circuit 1 is in a turn-off condition.

It should be noted that there is any element (such as a resistance element or a capacitive element) other than the $n^{th}$ transistor $M(n)$ between the $n^{th}$ gate node $Ng(n)$ and the high frequency signal terminal 3. In other words, the $n^{th}$ gate node $Ng(n)$ is not connected to the high frequency signal terminal 3 through any element other than the $n^{th}$ transistor $M(n)$.

1-2. Operation and Effect

When each transistor $M(k)$ is in the turn-on condition, the high frequency signal terminal 3 and the ground terminal 2 are shunted to dissipate the RF power to the ground terminal 2. On the other hand, when each transistor $M(k)$ is in the turn-off condition, the terminals are not shunted. In this turn-off condition, it is required that the leakage of RF power from the gate of each transistor $M(k)$ to the bias terminal 4 is suppressed (RF choke) as much as possible. Therefore, as mentioned above, the resistance elements $R(1)$ to $R(n)$ are provided as gate bias resistances.

Hereinafter, with reference to FIG. 3, the potential of each node in the turn-off condition is considered in detail. The bias potential at the bias terminal 4 is set, typically, to the ground potential or negative potential (in any case, it is RF ground) such that each transistor $M(k)$ is turned off. Also, for simplicity of description, it is supposed that the size (gate length and gate width) of the transistors $M(1)$ to $M(n)$ is the same. However, a similar argument is applied when each size is different.

The RF potential (input RF potential) of the high frequency signal terminal 3 is "Vin". At this time, the RF potential $Vc(k)$ of the $k^{th}$ connection node $Nc(k)$ is given by the following equation (1) derived from potential division among the transistors $M(1)$ to $M(n)$ connected in series.

$$Vc(k:k=1 \text{ to } n-1)=Vin \times k/n \qquad \text{Equation (1)}$$

The RF potential difference across the source and the drain in each transistor $M(k)$ is "Vin/n". Here, because the DC bias between the source and the drain is zero in each transistor $M(k)$, a capacitance between the source and the gate and a capacitance between the drain and the gate becomes equal to each other. Therefore, the RF potential $Vg(k)$ which appears at the gate of each transistor $M(k)$ becomes a middle between the source RF potential and the drain RF potential in the transistor $M(k)$. That is, the RF potential $Vg(k)$ at the $k^{th}$ gate node $Ng(k)$ is given by the following equation (2).

$$Vg(k:k=1 \text{ to } n)=Vin \times (\text{given}-1)/2n \qquad \text{Equation (2)}$$

In this case, the applied RF potential difference $Vr(k)$ across the both ends of the $k^{th}$ resistance element $R(k)$ is given by the following equation (3).

$$Vr(k:k=2 \text{ to } n)=Vin/n \qquad \text{Equation (3)}$$

$$Vr(1)=Vin/2n$$

Figure 1:
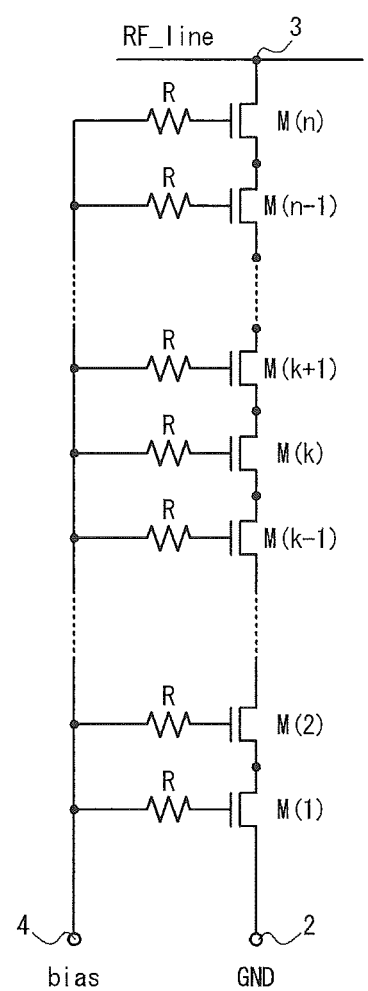
FIG. 1 is a diagram schematically showing the configuration of a shunt switch mentioned in Patent Literature 1.

Here, an applied potential difference across the both ends of each of the resistance elements in case of the configuration shown in FIG. 1 is considered for comparison. The gate potential of each transistor $M(k)$ is given by the above-mentioned equation (2). The RF potential of the bias terminal 4 is the ground potential. Therefore, the applied RF potential difference $Vr'(k)$ across the both ends of the resistance element connected to the gate of the transistor $M(k)$ is given by the following equation (4).

$$Vr'(k)=Vin \times (2k-1)/2n \qquad \text{Equation (4)}$$

As understood from the comparison of the equation (3) and the equation (4), when k is equal to or more than 2, the relation of $Vr(k)<Vr'(k)$ holds. That is, according to the present embodiment, the applied potential difference across each resistance element $R(k)$ becomes small remarkably, compared with the case of FIG. 1. Therefore, a resistance value which is necessary to obtain an equivalent RF choke effect becomes smaller than the case of FIG. 1. In other words, even if the resistance value of each resistance element R(k) is set low, the RF choke effect which is equivalent to the case of FIG. 1 can be accomplished. Therefore, the whole area of resistance elements R(1) to R(n) can be reduced.

In this way, according to the present embodiment, the high frequency switch circuit 1 in which the whole area of the gate bias resistances can be reduced can be realized.

Second Embodiment

Figure 3:
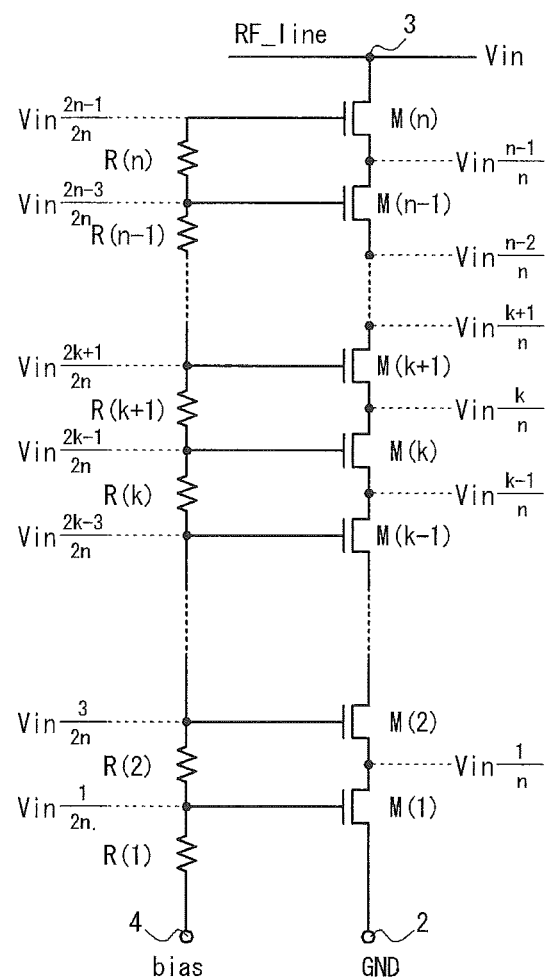
FIG. 3 is a diagram schematically showing an operation and an effect in the high frequency switch circuit according to the first embodiment.
Figure 4:
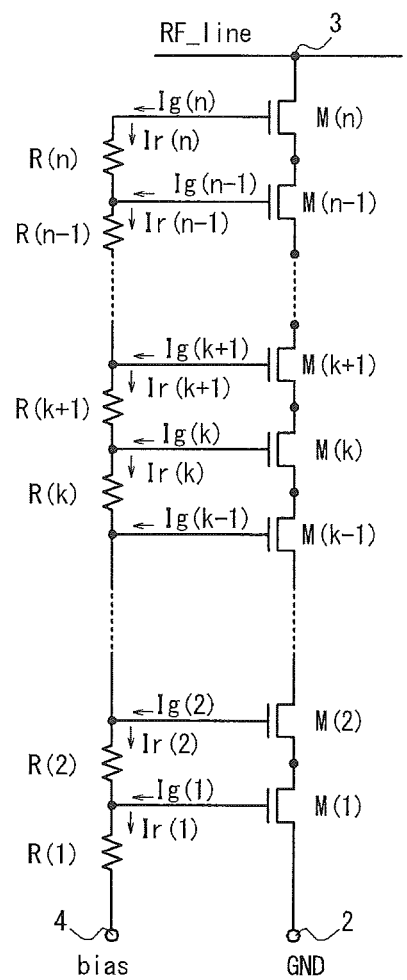
FIG. 4 is a diagram schematically showing the high frequency switch circuit according to a second embodiment.

FIG. 4 shows the state of the RF current in the configuration shown in the above-mentioned FIG. 2 and FIG. 3. The RF current which flows through the $k^{th}$ resistance element R(k) is referred to as an RF current Ir(k) hereinafter. Also, the gate RF current of the $k^{th}$ transistor M(k) is referred to as a gate RF current Ig(k) hereinafter. At this time, the following equation (5) holds.

$$Ir(n)=Ig(n)$$

$$Ir(k:k=1 \text{ to } n-1)=Ir(k+1)+Ig(k)>Ir(k+1) \quad \text{Equation (5)}$$

In other words, the RF current Ir(k) increases steadily from the $n^{th}$ resistance element R(n) to the first resistance element R(1), due to addition of the gate RF currents Ig(k). Therefore, the resistance value on the near side of the bias terminal 4 can be set lower than the resistance value on the far side. Because the RF current Ir on the near side of the bias terminal 4 becomes large, the equivalent RF choke effect can be attained even if the resistance value is set lower. The whole area of resistance elements R(1) to R(n) can be further reduced because the resistance value can be set further lower than in the first embodiment.

In the following description, the notation R(k) is used as the resistance value of the $k^{th}$ resistance element in addition to the reference numeral of the $k^{th}$ resistance element. At this time, the setting of the resistance values in the present embodiment is shown by the following equation (6).

$$R(l:l=2 \text{ to } n)>R(l-1) \quad \text{Equation (6)}$$

The parameter l may be any of 2 to n. That is, it is enough that the equation (6) is satisfied for at least a pair among the resistance elements R(1) to R(n). Then, the area reduction effect is obtained. Of course, the equation (6) may be satisfied for all of l=2 to n. This is equivalent to a case where the resistance value becomes smaller in an order from the $n^{th}$ resistance element R(n) to the first resistance element R(1). In this case, the area reduction effect increases more.

Hereinafter, a setting example of the resistance values will be described.

2-1. First Setting Example

In a first setting example, the resistance value R(k) is set such that the value of the gate RF current Ig(k) is the same as that of the configuration shown in FIG. 1. In the configuration shown in FIG. 1, the resistance values of all the resistance elements are the same as "R". At this time, the gate RF current Ig(k) of the $k^{th}$ transistor M(k) is given by the following equation (7).

$$Ig(k:k=1 \text{ to } n)=Vin\times(2k-1)/(2nR) \quad \text{Equation (7)}$$

On the other hand, in the present embodiment, the gate RF current Ig(k) is expressed as the following equation (8) (refer to the equation (5)).

$$Ig(n)=Ir(n)$$

$$Ig(k:k=1 \text{ to } n-1)=Ir(k)-Ir(k+1) \quad \text{Equation (8)}$$

Also, in the present embodiment, the RF current Ir(k) is derived from the above-mentioned equation (3) and is expressed by the following equation (9).

$$Ir(k:k=2 \text{ to } n)=Vin/(n\times R(k))$$

$$Ir(1)=Vin/(2n\times R(1)) \quad \text{Equation (9)}$$

The following equation (10) is derived from these equations (7) to (9) as a relational equation which is necessary to make the value of the gate RF current Ig(k) in the present embodiment coincide with that of the configuration shown in FIG. 1.

$$R(n)=2R/(2n-1)$$

$$R(k:k=2 \text{ to } n-1)=1/\{1/R(k+1)+(2k-1)/2R\}$$

$$R(1)=1/\{2/R(2)+1/R\} \quad \text{Equation (10)}$$

As an example, a case of n=8 and R=100 [kΩ] will be considered. In this case, the resistance values R(8) to R(1) which are calculated from the equation (10) are shown in FIG. 5. A total value of the resistance values R(8) to R(1) is about 41 [kΩ]. This is about 1/20 of 800 [kΩ] which is the total necessary resistance value in case of the configuration shown in FIG. 1. That is, even if the whole area of the resistance elements is reduced to 1/20, the equivalent RF choke effect can be accomplished.

2-2. Second Setting Example

In a second setting example, the resistance value R(k) is set such that the value of the gate RF current Ig(k) of each transistor M(k) is identical. For example, the gate RF current Ig(k) of each transistor M(k) is shown by the following equation (11).

$$Ig(k)=Ir(n)=Vin\times(2n-1)/(2nR) \quad \text{Equation (11)}$$

The following equation (12) is obtained from the equations (8), (9) and (11).

$$R(n)=2R/(2n-1)$$

$$R(k:k=2 \text{ to } n-1)=1/\{1/R(k+1)+(2n-1)/2R\}$$

$$R(1)=1/\{2/R(2)+1/R\} \quad \text{Equation (12)}$$

Likewise, in case of n=8 and R=100 [kΩ], the total value of the resistance values R(8) to R(1) which is calculated from the equation (12) is about 36 [kΩ]. That is, the area reduction effect is more, compared with the first setting example.

2-3. Third Setting Example

The above-mentioned equation (10) or equation (12) is only the setting example. The resistance value R(k) may be set higher than a value which is derived from the equation (10) or the equation (12). If the resistance value R(k) is several times of the value calculated from the equation (10) or the equation (12), the area reduction effect is sufficiently attained. Moreover, when the resistance value R(k) is set to a higher value, the increase brings the effect that the RF choke effect is improved. Therefore, both of the improvement of the RF choke effect and the area reduction effect can be made possible.

By easing the restriction for the resistance value, another advantage is sometimes produced in a circuit layout. For example, it is possible to provide the resistance elements R(1) to R(n) by preparing only the resistance elements with 10 [kΩ] and changing the number of series connections of the elements. Such a configuration has the advantage that the circuit layout time can be reduced. Or, there is an advantage that a process design kit to be used for the circuit layout can be simplified.

Third Embodiment

In the embodiments described above, the bias resistance configuration related to the gates of transistors M(k) has been described. Here, the same consideration can be applied to the back gates of the transistors M(k). In a third embodiment, the bias resistance configuration related to the back gates of the transistors M(k) will be described. It should be noted that the description which overlaps the above-mentioned embodiments is appropriately omitted.

Figure 6:
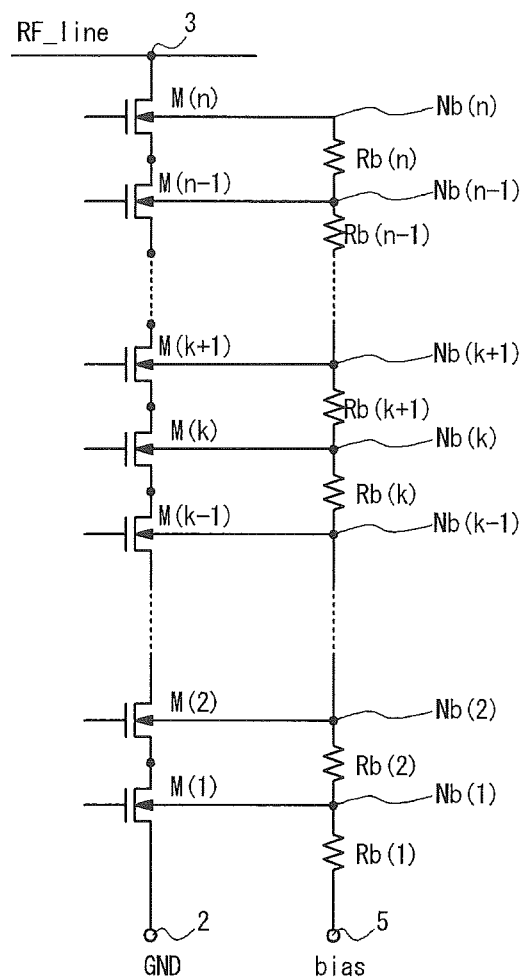
FIG. 6 is a diagram schematically showing the configuration of the high frequency switch circuit according to a third embodiment.

FIG. 6 shows the configuration of the high frequency switch circuit 1 according to the third embodiment. A node connected to the back gate of the $k^{th}$ transistor M(k) is a $k^{th}$ back gate node Nb(k). In other words, the back gates of the first transistor M(1) to the $n^{th}$ transistor M(n) are connected to the first back gate node Nb(1) to the $n^{th}$ back gate node Nb(n), respectively. A bias potential which is applied to the back gate is applied to a bias terminal 5.

The first resistance element Rb(1) is connected between the bias terminal 5 and the first back gate node Nb(1). Also, in case of k=2-n, the $k^{th}$ resistance element Rb(k) is connected between the $(k-1)^{th}$ back gate node Nb(k-1) and the $k^{th}$ back gate node Nb(k). That is, the first resistance element Rb(1) to the $n^{th}$ resistance element Rb(n) are connected in series in this order from the bias terminal 5 to the $n^{th}$ back gate node Nb(n). In other words, the resistance elements Rb(1) to Rb(n) are connected in series between the bias terminal 5 and the $n^{th}$ back gate node Nb(n). The resistance elements Rb(1) to Rb(n) function as the back gate bias resistance elements which suppress leakage of RF power from the back gates of the transistors M(1) to M(n) to the bias terminal 5 when the high frequency switch circuit 1 is in the turn-off condition.

It should be noted that any element (resistance element and capacitance element) other than the $n^{th}$ transistor M(n) does not intervene between the $n^{th}$ back gate node Nb(n) and the high frequency signal terminal 3. In other words, the $n^{th}$ back gate node Nb(n) is not connected to the high frequency signal terminal 3 through any element other than the $n^{th}$ transistor M(n).

By the configuration described above, the same effect as the effects in the above-mentioned embodiments about the back gate can be obtained.

Fourth Embodiment

Figure 7:
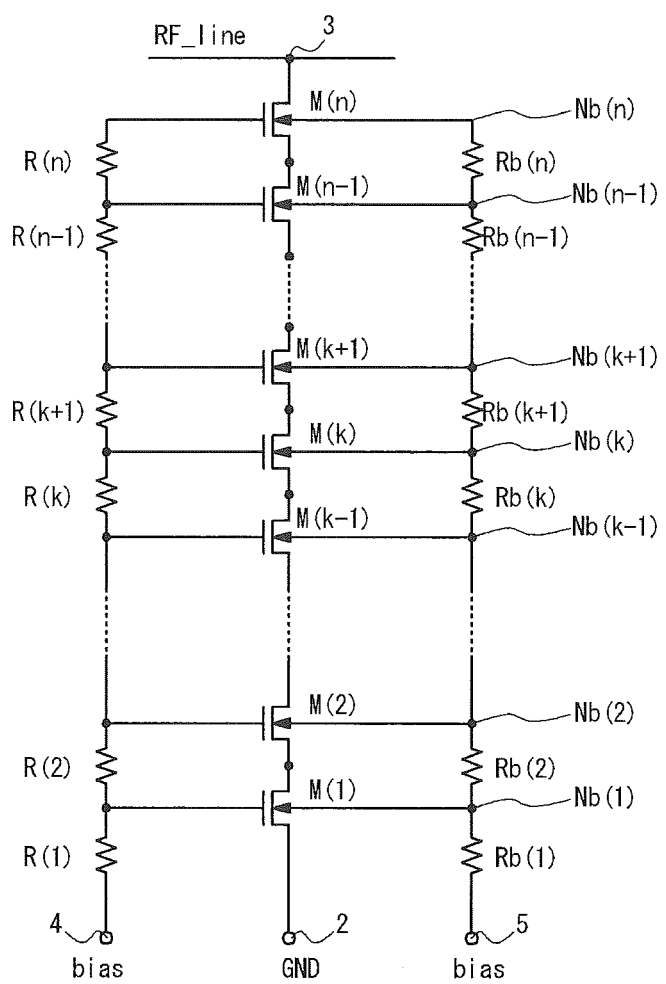
FIG. 7 is a diagram schematically showing the configuration of the high frequency switch circuit according to a fourth embodiment.

FIG. 7 shows the configuration of the high frequency switch circuit 1 according to a fourth embodiment. The fourth embodiment is a combination of the first embodiment or the second embodiment and the third embodiment. The same effect as the effect described in the above-mentioned embodiments about both of the gate and the back gate is obtained.

Fifth Embodiment

Figure 8:
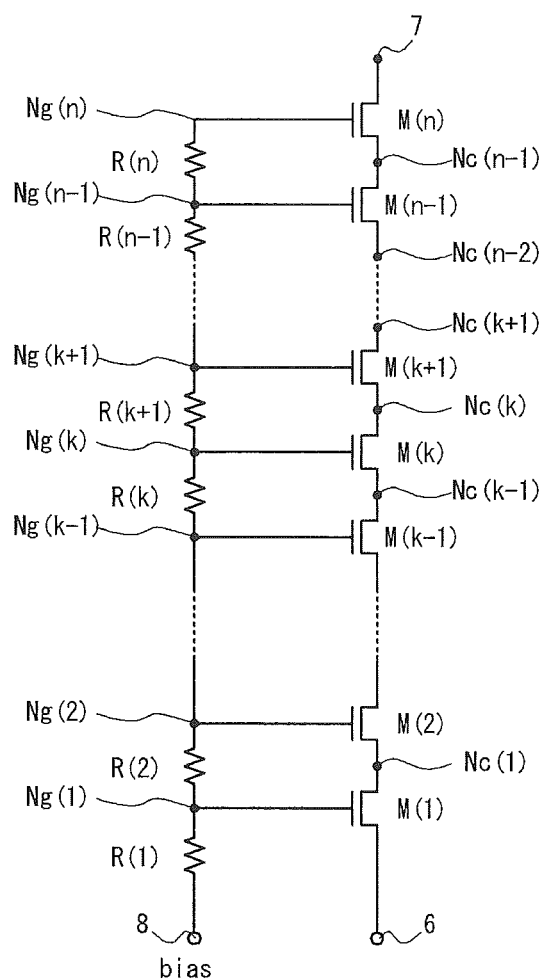
FIG. 8 is a diagram schematically showing the configuration of the high frequency switch circuit according to a fifth embodiment.

The high frequency switch circuit 1 is not limited to the shunt switch. FIG. 8 shows a configuration of more generalized high frequency switch circuit 1 (for convenience, to be referred to as a high frequency switch circuit 1'). It should be noted that the description which overlaps the above-mentioned embodiments is appropriately omitted.

As shown in FIG. 8, the n transistors M(1) to M(n) are connected in series (stack-connected) between the first terminal 6 and the second terminal 7. Also, the gate of each transistor M(k) is connected to the bias terminal 8 through the resistance elements. When the first terminal 6 is the ground terminal and the second terminal 7 is the high frequency signal terminal, the high frequency switch circuit 1' has the same configuration as the shunt switch shown in the above embodiments.

For example, the high frequency switch circuit 1' is an SPST switch, and the second terminal 7 is connected to an antenna and the first terminal 6 is connected to a receiving circuit. The same operation and effect as those described in the above embodiments can be obtained when such an SPST switch is in the turn-off condition.

On the other hand, it is necessary to consider a RF choke characteristic in the turn-on condition in case of the SPST switch. Because the leakage of RF power from the gate of the first transistor M(1) to the bias terminal 8 can be large when the resistance value R(1) is set low as shown in FIG. 5. However, in the application where the leakage of RF power in such turn-on condition is not so important on a characteristic, the high frequency switch circuit 1' can be used.

Also, by setting the resistance value R(1) high, the RF choke effect in the turn-on condition can be improved. For example, the resistance value R(1) is set to "R/n". In this case, an enough RF choke effect can be obtained and moreover the whole area of the resistance elements can be reduced, in both of the turn-on condition and the turn-off condition.

Sixth Embodiment

Figure 9:
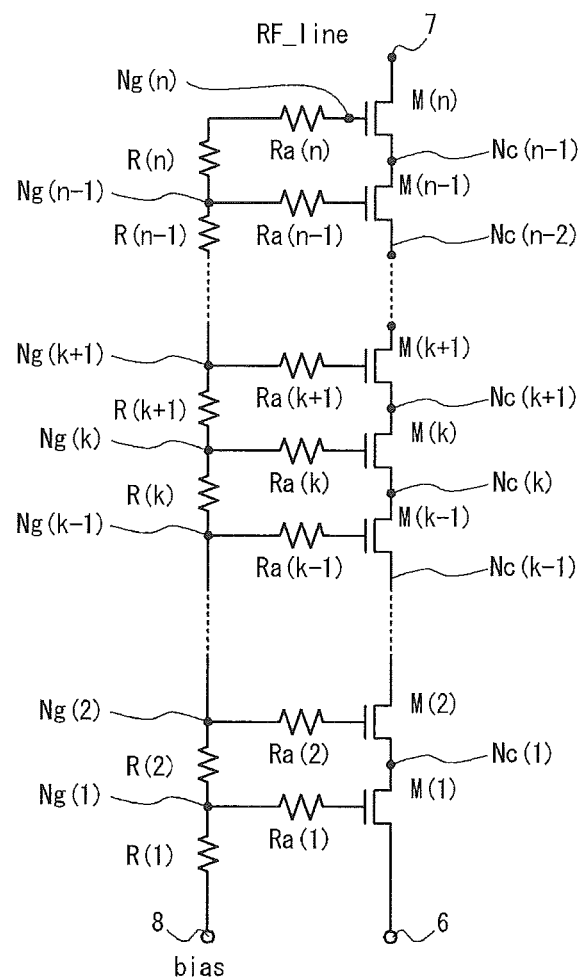
FIG. 9 is a diagram schematically showing the configuration of the high frequency switch circuit according to a sixth embodiment.

FIG. 9 shows a configuration of the high frequency switch circuit 1' according to a sixth embodiment. The resistance elements Ra(1) to Ra(n) are added from the configuration of the fifth embodiment (see FIG. 8). The resistance element Ra(k: k=1 to n-1) is connected between the gate of the $k^{th}$ transistor M(k) and the $k^{th}$ gate node Ng(k). The resistance element Ra(n) is connected between the $n^{th}$ gate node Ng(n) and the $n^{th}$ the resistance element R(n). The other configuration is the same as that of the fifth embodiment.

According to the present embodiment, a nature of an intermediate configuration between the configuration shown in FIG. 1 and the configuration shown in the fifth embodiment can be obtained. That is, the area of the resistance elements can be reduced while keeping the RF choke effect in the switch turn-on condition.

Figure 10:
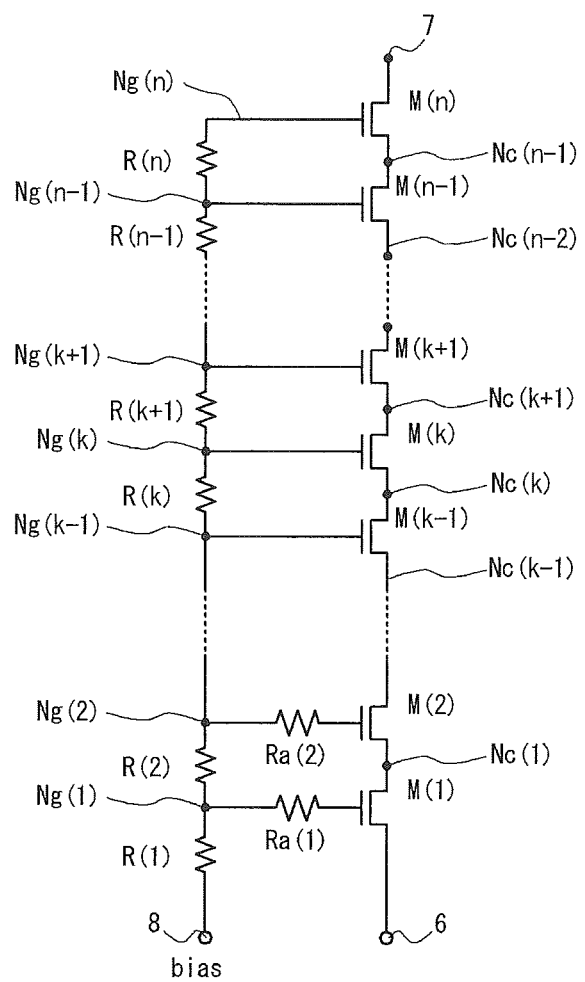
FIG. 10 is a diagram schematically showing a modification example of the configuration of the high frequency switch circuit according to the sixth embodiment.

FIG. 10 shows an example with modification. As shown in FIG. 10, not all of the resistance elements Ra(1) to Ra(n) but a part thereof may be added. At this time, it is desirable that the resistance element Ra(l) connected to the first resistance element R(1) of a low resistance value is added at least. The area of the resistance elements can be reduced while keeping the RF choke effect in the switch turn-on condition.

Seventh Embodiment

Figure 11:
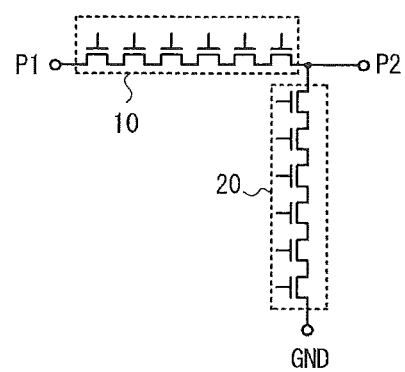
FIG. 11 is a diagram schematically showing the configuration of the high frequency switch circuit according to a seventh embodiment.

FIG. 11 is a diagram schematically showing the configuration of an SPST switch with a shunt function. The SPST switch with the shunt function has a branch 10 and a branch 20. The branch 10 is connected between a first port P1 and a second port P2. The branch 20 is connected between the second port P2 and a ground terminal. The first port P1 is connected to an antenna and the second port P2 is connected to a receiving circuit.

In such a configuration, the above-mentioned high frequency switch circuit 1 (see FIG. 2 to FIG. 7) can be used as the branch 20. Thus, the area reduction effect is obtained.

Or, the above-mentioned high frequency switch circuit 1' (see FIG. 8 to FIG. 10) can be used as the branch 10. In this case, the first terminal 6 is connected to the second port P2 and the second terminal 7 is connected to the first port P1. Then, the area reduction effect is obtained.

Or, the above-mentioned high frequency switch circuit 1 is used as the branch 20 and the above-mentioned high frequency switch circuit 1' can be used as the branch 10. Thus, an area reduction effect becomes more.

Eighth Embodiment

Figure 12:
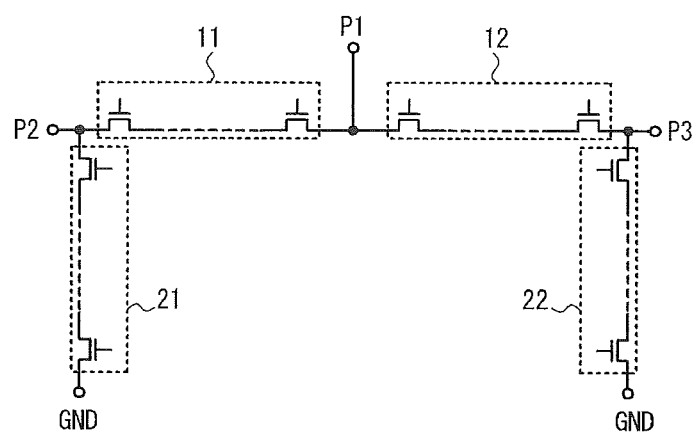
FIG. 12 is a diagram schematically showing the configuration of the high frequency switch circuit according to an eighth embodiment.

FIG. 12 is a diagram schematically showing the configuration of an SPDT switch with shunt function. The SPDT switch with shunt function has the branches 11, 12, 21, and 22. The branch 11 is connected between the first port P1 and the second port P2. The branch 21 is connected between the second port P2 and the ground terminal. The branch 12 is connected between the first port P1 and a third port P3. The branch 22 is connected between the third port P3 and the ground terminal. The first port P1 is connected to the antenna.

In such a configuration, the above-mentioned high frequency switch circuit 1 (see FIG. 2 to FIG. 7) can be used as at least one of the branches 21 and 22. Thus, the area reduction effect is obtained.

Or, the above-mentioned high frequency switch circuit 1' (see FIG. 8 to FIG. 10) can be used as at least one of the branches 11 and 12. In this case, the first terminal 6 is connected to the second port P2 or the third port P3, and the second terminal 7 is connected to the first port P1. Then, the area reduction effect is obtained.

Or, the above-mentioned high frequency switch circuit 1 can be used as at least one of the branches 21 and 22, and the above-mentioned high frequency switch circuit 1' can be used as at least one of the branches 11 and 12. Thus, area reduction effect becomes more.

As an example, a case where the first port P1 is connected to the antenna, the second port P2 is connected to a transmission power amplifier, and the third port P3 is connected to a low noise receiving amplifier. In this case, it is suitable that the above-mentioned high frequency switch circuit 1' is used as the branch 12 and the above-mentioned high frequency switch circuit 1 is used for both of the branches 21 and 22. In the turn-on condition of the branch 12, the RF choke effect becomes weak, but in the receiving condition, the increase of the loss and the increase of the distortion as the result of weak RF choke effect, is not so critical.

Ninth Embodiment

Figure 13:
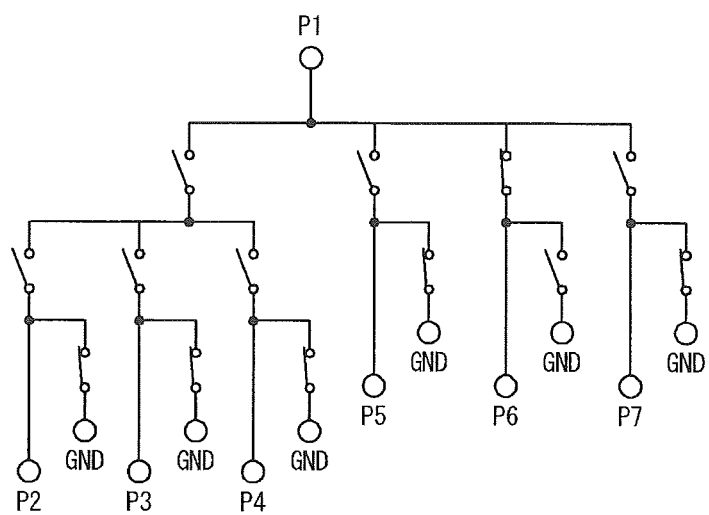
FIG. 13 is a diagram schematically showing the configuration of the high frequency switch circuit according to a ninth embodiment.

FIG. 13 shows an example of a more complicated port configuration. In such a configuration, by using the above-mentioned high frequency switch circuit 1 (see FIG. 2 to FIG. 7) as a switch connected to the ground terminal, the area reduction effect is obtained. Also, by using the above-mentioned high frequency switch circuit 1' (see FIG. 8 to FIG. 10) as the switch connected to each port, the area reduction effect is obtained.

It should be noted that the above-mentioned embodiments may be combined in a range of no contradiction.

In the above, the embodiments of the present invention have been described. However, the present invention is not limited to the above embodiments various modifications can be carried out in a range not deviating from the scope of the invention.

What is claimed is:
1. A high frequency switch circuit comprising:
a first terminal;
a second terminal;
a bias terminal;
n (n is an integer more than one) number of transistors connected in series in an order from a first transistor to an $n^{th}$ transistor from said first terminal to said second terminal;
first to $n^{th}$ nodes connected to gates of said first to $n^{th}$ transistors; and
n number of resistance elements connected in series in an order from a first resistance element to an $n^{th}$ resistance element from said bias terminal to said $n^{th}$ node,
wherein said first resistance element is connected between said bias terminal and said first node,
wherein a $k^{th}$ resistance element (k=2 to n) is connected between said $(k-1)^{th}$ node and said $k^{th}$ node, and
wherein a gate current value of a $k^{th}$ transistor is identical to a gate current value of a $(k-1)^{th}$ transistor.

2. The high frequency switch circuit according to claim 1, wherein said $n^{th}$ node is not connected to said second terminal through any element other than said $n^{th}$ transistor.

3. The high frequency switch circuit according to claim 1, wherein a resistance value of an $l^{th}$ resistance element (l is any of integers of 2 to n) is greater than a resistance value of an $(l-1)^{th}$ resistance element.

4. The high frequency switch circuit according to claim 3, wherein the resistance values decrease in an order of from said $n^{th}$ resistance element to said first resistance element.

5. The high frequency switch circuit according to claim 1, further comprising:
a back gate bias terminal;
first to $n^{th}$ back gate nodes respectively connected to back gates of said first to $n^{th}$ transistors; and
n number of back gate resistance elements connected in series in an order from a first back gate resistance element to an $n^{th}$ back gate resistance element from said back gate bias terminal to said $n^{th}$ back gate node,
wherein said first back gate resistance element is connected between said back gate bias terminal and said first back gate node, and
a $k^{th}$ back gate resistance element (k=2 to n) is connected between a $(k-1)^{th}$ back gate node and a $k^{th}$ back gate node.

6. The high frequency switch circuit according to claim 1, wherein said first terminal comprises a ground terminal to which a ground potential is applied, and
wherein said second terminal comprises a high frequency signal terminal to which a high frequency signal is applied.

7. The high frequency switch circuit according to claim 1, wherein said $n^{th}$ node is connected to said second terminal only through said $n^{th}$ transistor.

8. The high frequency switch circuit according to claim 1, wherein n is an integer greater than 2.

9. The high frequency switch circuit according to claim 1, wherein a resistance value of said kth resistance element is set so that a gate current value of a $k^{th}$ transistor is identical to a gate current value of a $(k-1)^{th}$ transistor.

10. The high frequency switch circuit according to claim 1, wherein a capacitance value between a source and the gate of said $k^{th}$ transistor is identical to a capacitance value between a drain and the gate of said $k^{th}$ transistor.

11. The high frequency switch circuit according to claim 1, wherein a voltage value of said $k^{th}$ node equals a voltage of said first terminal multiplied by $(2k-1/2n)$.

12. A semiconductor device comprising:
n (n is an integer more than one) number of transistors connected in series;

first to $n^{th}$ nodes connected to gates of said first to $n^{th}$ transistors, respectively; and n number of resistance elements connected in series in an order from a first resistance element to an $n^{th}$ resistance element, wherein said first resistance element is connected to said first node, and wherein a gate current value of one of said n number of transistors is equal to a gate current value of another one of said n number of transistors.

* * * * *